United States Patent
Jung et al.

(10) Patent No.: US 9,549,140 B2
(45) Date of Patent: Jan. 17, 2017

(54) IMAGE SENSOR HAVING PIXELS EACH WITH A DEEP TRENCH ISOLATION REGION AS A PHOTO GATE FOR OUTPUTTING IMAGE SIGNALS IN RESPONSE TO CONTROL SIGNALS FROM A ROW DRIVER AND METHOD OF OPERATING THE IMAGE SENSOR

(71) Applicant: Samsung Electronics Co., Ltd., Suwon-si (KR)

(72) Inventors: Young-Woo Jung, Yongin-si (KR); Kyung-Ho Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 148 days.

(21) Appl. No.: 14/619,176

(22) Filed: Feb. 11, 2015

(65) Prior Publication Data
US 2016/0021322 A1    Jan. 21, 2016

(30) Foreign Application Priority Data
Jul. 15, 2014    (KR) .................... 10-2014-0089349

(51) Int. Cl.
H01L 27/146    (2006.01)
H04N 5/378    (2011.01)
H04N 5/232    (2006.01)
H04N 5/353    (2011.01)
(Continued)

(52) U.S. Cl.
CPC .......... *H04N 5/378* (2013.01); *H01L 27/1461* (2013.01); *H01L 27/1463* (2013.01); *H01L 27/14612* (2013.01); *H04N 5/23245* (2013.01); *H04N 5/3532* (2013.01); *H04N 5/3575* (2013.01); *H04N 5/37457* (2013.01)

(58) Field of Classification Search
CPC ........... H01L 27/1463; H01L 27/14601; H01L 27/307; H04N 3/155; H04N 5/378
See application file for complete search history.

(56) References Cited

U.S. PATENT DOCUMENTS

| | | |
|---|---|---|
| 6,194,770 B1 | 2/2001 | Zarnowski et al. |
| 6,232,626 B1 | 5/2001 | Rhodes |
| 7,091,059 B2 | 8/2006 | Rhodes |

(Continued)

FOREIGN PATENT DOCUMENTS

| | | |
|---|---|---|
| KR | 100782312 | 12/2007 |
| KR | 100847742 | 7/2008 |
| KR | 2009102398 | 9/2009 |

*Primary Examiner* — Que T Le
(74) *Attorney, Agent, or Firm* — Onello & Mello, LLP (57) ABSTRACT

An image sensor includes a row driver, a pixel array, an analog-to-digital converter, and an output compensating circuit. The row driver generates a photo-gate control signal, a storage control signal, a transfer control signal, a reset control signal and a row selecting signal. The pixel array includes a plurality of pixels, and each pixel uses a deep trench isolation (DTI) region as a photo gate. The pixel array receives optical signals, converts the optical signals to electric signals, and outputs the electric signals as image signals in response to the photo-gate control signal, the storage control signal, the transfer control signal, the reset control signal, and the row selecting signal. The analog-to-digital converter performs an analog-to-digital conversion on the image signals to generate first signals, and the output compensating circuit compensates the first signals.

20 Claims, 9 Drawing Sheets

(51) Int. Cl.
*H04N 5/357* (2011.01)
*H04N 5/3745* (2011.01)

(56) References Cited

U.S. PATENT DOCUMENTS

| | | |
|---|---|---|
| 7,279,766 B2 * | 10/2007 | Rhodes ............. H01L 27/14601 |
| | | 257/443 |
| 7,626,685 B2 | 12/2009 | Jin et al. |
| 7,741,665 B2 | 6/2010 | Kang et al. |
| 8,339,492 B2 | 12/2012 | Hwang |
| 8,440,490 B2 | 5/2013 | Adkisson et al. |
| 2001/0032979 A1 | 10/2001 | Rhodes |
| 2003/0089929 A1 | 5/2003 | Rhodes |
| 2008/0105905 A1 | 5/2008 | Kang et al. |
| 2009/0244514 A1 | 10/2009 | Jin et al. |
| 2010/0148221 A1 | 6/2010 | Yu et al. |
| 2011/0032979 A1 | 2/2011 | Matsuo et al. |
| 2011/0226936 A1 | 9/2011 | Pain et al. |
| 2013/0175582 A1 | 7/2013 | Ihara et al. |

* cited by examiner

IMAGE SENSOR HAVING PIXELS EACH WITH A DEEP TRENCH ISOLATION REGION AS A PHOTO GATE FOR OUTPUTTING IMAGE SIGNALS IN RESPONSE TO CONTROL SIGNALS FROM A ROW DRIVER AND METHOD OF OPERATING THE IMAGE SENSOR

CROSS-REFERENCE TO RELATED APPLICATION

This U.S. non-provisional application claims priority under 35 U.S.C. §119 to Korean Patent Application No. 10-2014-0089349 filed on Jul. 15, 2014, the contents of which are herein incorporated by reference in their entirety.

BACKGROUND

Field

Embodiments of the present inventive concepts relate to an image sensor and an image processing device including the image sensor.

Description of Related Art

An image sensor, particularly a CMOS image sensor, may be mounted in a camera of a mobile phone, a digital still camera, or the like. The CMOS image sensor takes images in the field of view, converts the images into electric signals, and converts the electric signals into transmittable digital image signals. The digital image signals output from the CMOS image sensor are color image data having three colors (red, green, and blue). A signal processing is performed on the digital image signals to drive a display device such as a liquid crystal display (LCD).

SUMMARY

Embodiments of the present inventive concepts provide an image sensor capable of improving a sensing efficiency.

Some embodiments of the present inventive concepts provide a method of operating an image sensor capable of improving a sensing efficiency.

According to an aspect of the present inventive concepts, an image sensor may include a row driver, a pixel array, an analog-to-digital converter, and an output compensating circuit.

The row driver is configured to generate a photo-gate control signal, a storage control signal, a transfer control signal, a reset control signal and a row selecting signal. The pixel array is configured to include a plurality of pixels, and each pixel of the plurality of pixels of the pixel array uses a deep trench isolation (DTI) region as a photo gate. The pixel array is configured to receive optical signals, convert the optical signals to electric signals, and output the electric signals as image signals in response to the photo-gate control signal, the storage control signal, the transfer control signal, the reset control signal, and the row selecting signal. The analog-to-digital converter is configured to perform an analog-to-digital conversion on the image signals to generate first signals. The output compensating circuit is configured to compensate the first signals to generate second signals.

In some embodiments, the photo-gate control signal is applied to the DTI region and a magnitude of the photo-gate control signal applied to the DTI region may be adjustable.

In some embodiments, a magnitude of the photo-gate control signal applied to the DTI region may be adjustable by toggling.

In some embodiments, the plurality of pixels included in the pixel array may be electrically separated by the DTI region.

In some embodiments, the image sensor may control a number of total electrons that is included in a photo diode included in each pixel of the plurality of pixels of the pixel array by adjusting a magnitude of the photo-gate control signal applied to the DTI region.

In some embodiments, a photo diode included in each pixel of the pixel array may include an N-type semiconductor material.

In some embodiments, the photo-gate control signal is applied to the DTI region and the photo-gate control signal applied to the DTI region may have a negative voltage, when a high gain is required.

In some embodiments, when the photo-gate control signal having the negative voltage is applied to the DTI region of each of the plurality of pixels included in the pixel array, a number of holes may increase at a portion of a photo-diode region adjacent to the DTI region of each pixel of the plurality of pixels included in the pixel array.

In some embodiments, when the photo-gate control signal having the negative voltage is applied to the DTI region of each pixel of the plurality of pixels of the pixel array, a size of a photo diode of each pixel of the plurality of pixels included in the pixel array may decrease.

In some embodiments, the photo-gate control signal applied to the DTI region may have a negative voltage, when light intensity is low.

In some embodiments, when a low gain is required, the photo-gate control signal applied to the DTI region may have a voltage which is higher than a voltage used when a high gain is required.

In some embodiments, when the photo-gate control signal having the voltage which is higher than the voltage used when a high gain is required is applied to the DTI region of each pixel of the plurality of pixels included in the pixel array, a number of holes may decrease at a portion of a photo-diode region adjacent to the DTI region of each pixel of the plurality of pixels included in the pixel array.

In some embodiments, when the photo-gate control signal having the voltage which is higher than the voltage used when a high gain is required is applied to the DTI region of each pixel of the plurality of pixels included in the pixel array, a size of a photo diode of each pixel of the plurality of pixels included in the pixel array may increase.

In some embodiments, when light intensity is high, the photo-gate control signal applied to the DTI region may have a voltage which is higher than a voltage used when a high gain is required.

According to another aspect of the present inventive concepts, an image sensor may include a row driver, a pixel array, an analog-to-digital converter, and an output compensating circuit.

The row driver is configured to generate a photo-gate control signal, a storage control signal, a transfer control signal, a reset control signal and a row selecting signal. The pixel array includes a plurality of pixels, and each pixel of the plurality of pixels of the pixel array using a DTI region as a photo gate. The pixel array is configured to receive optical signals, convert the optical signals to electric signals, and output the electric signals as image signals in response to the photo-gate control signal, the storage control signal, the transfer control signal, the reset control signal, and the row selecting signal. The analog-to-digital converter is configured to perform an analog-to-digital conversion on the image signals to generate first signals. The output compensating circuit is configured to compensate the first signals to generate second signals. The image sensor controls a number of total electrons that is included in a photo diode included in each pixel of the plurality of pixels of the pixel array by adjusting a magnitude of the photo-gate control signal applied to the DTI region.

In some embodiments, a boron-passivation may be processed in a portion of a photo-diode region adjacent to the DTI region of each pixel of the plurality of pixels included in the pixel array.

In some embodiments, the photo-gate control signal applied to the DTI region may have a negative voltage when a high gain is required.

In some embodiments, a number of holes may increase at a portion of a photo-diode region adjacent to the DTI region of each pixel of the plurality of pixels included in the pixel array because of the boron-passivation and the photo-gate control signal having the negative voltage applied to the DTI region.

In some embodiments, when a low gain is required the photo-gate control signal applied to the DTI region may have a voltage which is higher than a voltage used when a high gain is required.

According to another aspect of the present inventive concepts, a method of operating an image sensor may include generating a photo-gate control signal, a storage control signal, a transfer control signal, a reset control signal and a row selecting signal; adjusting a magnitude of the photo-gate control signal applied to a DTI region to control a number of total electrons that are included in a photo diode included in each pixel of the pixel array; receiving optical signals and converting the optical signals to electric signals; outputting the electric signals as image signals in response to the photo-gate control signal, the storage control signal, the transfer control signal, the reset control signal, and the row selecting signal; sampling the image signals and performing an analog-to-digital conversion on the sampled image signals to generate first signals; and compensating the first signals to generate second signals.

In some embodiments, the method of operating an image sensor may further include applying a photo-gate control signal having a negative voltage to the DTI region, when a high gain is required.

In some embodiments, the method of operating an image sensor may further include applying a photo-gate control signal having a voltage which is higher than a voltage used when a high gain is required to the DTI region, when a low gain is required.

According to another aspect of the present inventive concepts, an image sensor includes a row driver configured to generate a photo-gate control signal, a storage control signal, a transfer control signal, a reset control signal and a row selecting signal. The image sensor may further includes a pixel array configured to include a plurality of pixels, receive the photo-gate control signal, the storage control signal, the transfer control signal, the reset control signal and the row selecting signal, receive optical signals, convert the optical signals to electric signals, and output the electric signals as image signals in response to the photo-gate control signal, the storage control signal, the transfer control signal, the reset control signal, and the row selecting signal. The plurality of pixels of the pixel array may be electrically separated from each other by a deep trench isolation (DTI) region. The image sensor may further include an analog-to-digital converter configured to perform an analog-to-digital conversion on the image signals to generate first signals and an output compensating circuit configured to compensate the first signals to generate second signals.

In some embodiments, each pixel of the plurality of pixels of the pixel array uses the DTI region as a photo gate.

In some embodiments, the photo-gate control signal is applied to the DTI region and wherein a magnitude of the photo-gate control signal applied to the DTI region is adjustable.

In some embodiments, the image sensor is configured to control a number of total electrons that are included in a photo diode included in each pixel of the plurality of pixels of the pixel array by adjusting a magnitude of the photo-gate control signal applied to the DTI region.

In some embodiments, the photo-gate control signal is applied to the DTI region and wherein, when a high gain is required, the photo-gate control signal applied to the DTI region is configured to have a negative voltage and wherein, when a low gain is required, the photo-gate control signal applied to the DTI region is configured to have a voltage which is higher than the voltage used when a high gain is required.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts.

DETAILED DESCRIPTION OF THE EMBODIMENTS

Various example embodiments will be described more fully hereinafter with reference to the accompanying drawings, in which some example embodiments are shown. The present inventive concepts may, however, be embodied in many different forms and should not be construed as limited to the example embodiments set forth herein.

It will be understood that, although the terms "first," "second," etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present inventive concepts.

It will be understood that when an element or layer is referred to as being "on," "connected to," or "coupled to" another element or layer, it can be directly on, connected or coupled to the other element or layer or intervening elements or layers may be present. In contrast, when an element or layer is referred to as being "directly on," "directly connected to," or "directly coupled to" another element or layer, there are no intervening elements or layers present.

The terminology used herein is for the purpose of describing particular example embodiments only and is not intended to be limiting of the present inventive concepts. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Hereinafter, the inventive concepts will now be described more fully with reference to the accompanying drawings, in which embodiments of the inventive concepts are shown.

Figure 1:
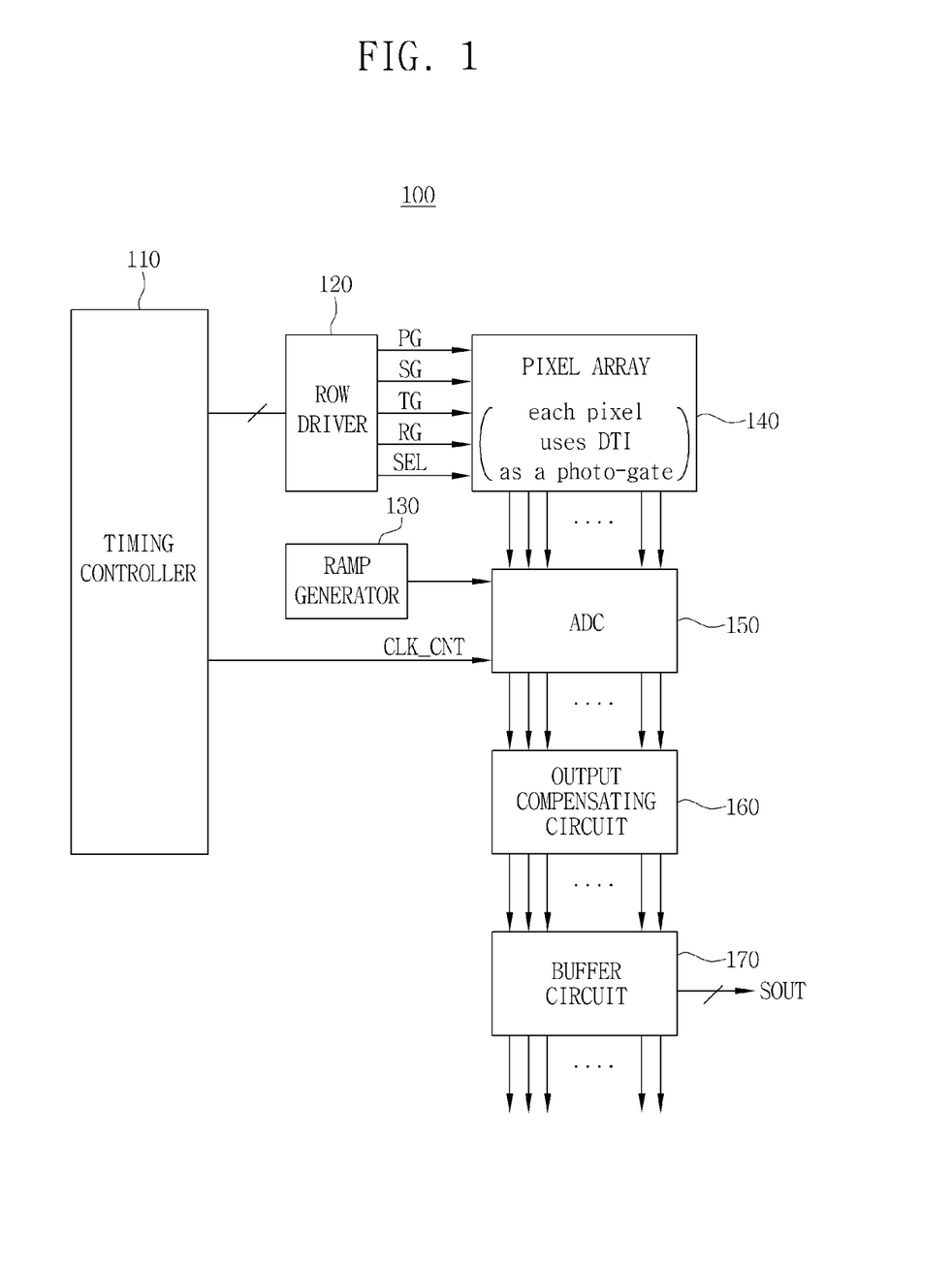
FIG. 1 is a block diagram illustrating an image sensor in accordance with an example embodiment of the inventive concepts.

FIG. 1 is a block diagram illustrating an image sensor 100 in accordance with an example embodiment of the inventive concepts.

Referring to FIG. 1, the image sensor 100 may include a timing controller 110, a row driver 120, a ramp generator 130, a pixel array 140, an analog-to-digital converter (ADC) 150, an output compensating circuit 160 and a buffer circuit 170.

The timing controller 110 may generate control signals to control operations of the row driver 120 and the ADC 150 and provide the control signals to the row driver 120 and ADC 150, respectively. The row driver 120 generates control signals, for example, a photo-gate control signal PG, a storage control signal SG, a transfer control signal TG, a reset control signal RG, and a row selecting signal SEL, to control an operation of the pixel array 140 in response to a control signal received from the timing controller 110. The row driver 120 provides the photo-gate control signal PG, the storage control signal SG, the transfer control signal TG, the reset control signal RG, and the row selecting signal SEL to the pixel array 140. The pixel array 140 outputs electric signals as image signals in response to the photo-gate control signal PG, the storage control signal SG, the transfer control signal TG, the reset control signal RG and the row selecting signal SEL. The pixel array 140 includes a plurality of pixels. The pixel array 140 may include red pixels for converting a light of a red spectral region to electric signals, green pixels for converting a light of a green spectral region to electric signals, and blue pixels for converting a light of a blue spectral region to electric signals. Each pixel included in the pixel array 140 uses a deep trench isolation (DTI) region as a photo gate. The ramp generator 130 generates a ramp signal and provides the ramp signal to the ADC 150. The ADC 150 receives image signals in an analog form from the pixel array 140 in response to the ramp signal received from the ramp generator 130 and a clock signal CLK_CNT received from the timing controller 110, performs an analog-to-digital conversion on the image signals and generates first signals. The ADC 150 may convert analog signals to digital signals using a correlated double sampling (CDS) method. The output compensating circuit 160 may correct output signals received from the ADC 150, that is, the first signals, using a signal corresponding to a row having a light signal and a signal corresponding to a row not having a light signal of the output signals. The output compensating circuit 160 is configured to compensate the first signals to generate second signals. The buffer circuit 170 latches and amplifies output signals of the output compensating circuit 160, that is, the second signals, to generate sensor output signals SOUT.

Figure 2:
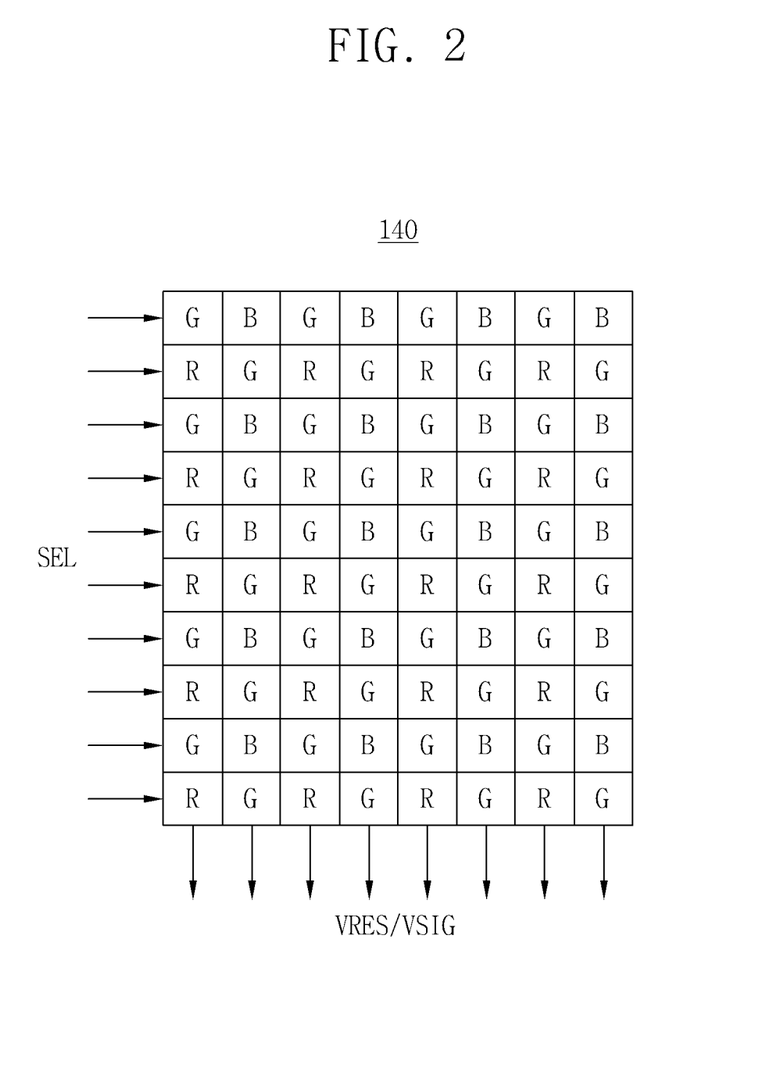
FIG. 2 is a diagram illustrating a color filter pattern of a pixel array included in the image sensor of FIG. 1, in accordance with an example embodiment of the inventive concepts.

FIG. 2 is a diagram illustrating a color filter pattern of the pixel array 140 included in the image sensor 100 of FIG. 1, in accordance with an example embodiment of the inventive concepts.

Referring to FIG. 2, a color filter may be disposed on each pixel included in the pixel array 140 such that each pixel in the pixel array 140 receives only a light of a particular color. For example, three kinds of color filters may be disposed on the pixels included in the pixel array 140. Generally, the color filters may be disposed in a Bayer pattern in which a first pattern having two colors of red (R) and green (G) is disposed in a first row and a second pattern having two colors of green (G) and blue (B) is disposed in a row adjacent to the first row. The green color (G), which is related to brightness, may be disposed in all rows, and the red color (R) and the blue color (B) may be alternately and diagonally disposed in the rows to enhance resolution.

In the image sensor 100 having a pixel structure as described above, the pixel array 140 senses a light of a photo diode, and converts the light into electric signals to generate image signals.

Figure 3:
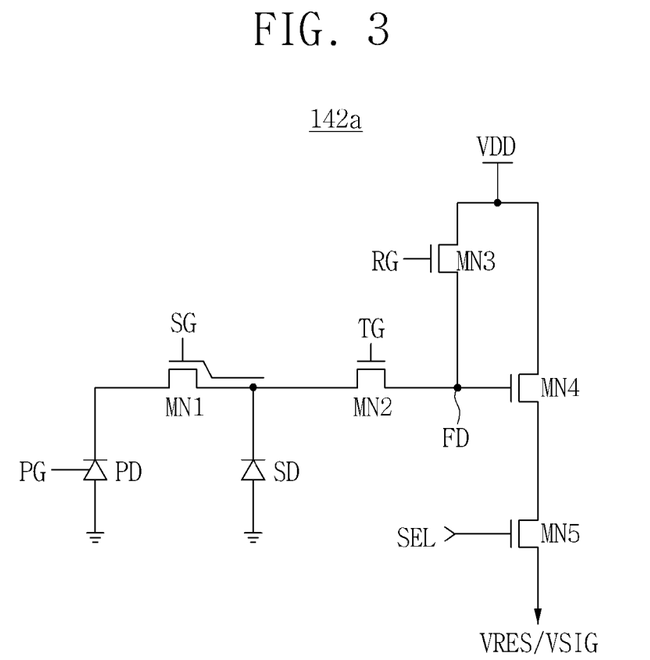
FIG. 3 is a circuit diagram illustrating a pixel driving circuit that drives a unit pixel of a pixel array included in the image sensor of FIG. 1, in accordance with an example embodiment of the inventive concepts.

FIG. 3 is a circuit diagram illustrating a pixel driving circuit 142*a* that drives a unit pixel of a pixel array 140 included in the image sensor 100 of FIG. 1, in accordance with an example embodiment of the inventive concepts.

Referring to FIG. 3, the pixel driving circuit 142*a* may include a photo diode PD, a storage diode SD and NMOS transistors MN1, MN2, MN3, MN4 and MN5. The photo diode PD converts light signals into electric signals in response to the photo-gate control signal PG The first NMOS transistor MN1 is called a storage transistor. The first NMOS transistor MN1 operates in response to the storage control signal SG and transfers charges generated in the photo diode PD to the storage diode SD. A cathode of the storage diode SD may be a storage diode region. The second NMOS transistor MN2 is called a transfer transistor. The second NMOS transistor MN2 operates in response to the transfer control signal TG, and transfers charges accumulated in the storage diode SD to a floating diffusion node FD. The third NMOS transistor MN3 is called a reset transistor. The third NMOS transistor MN3 operates in response to the reset control signal RG, and resets the floating diffusion node FD using a supply voltage VDD. The fourth NMOS transistor MN4 is called a driving transistor. The fourth NMOS transistor MN4 operates in response to a voltage of the floating diffusion node FD, and outputs electric signals that are proportional to an amount of charges transferred from the storage diode SD to the floating diffusion node FD. The fifth NMOS transistor MN5 is called a selecting transistor. The fifth NMOS transistor MN5 operates in response to the row selecting signal SEL, and transmits an output signal of the fourth NMOS transistor MN4 to the ADC 150. Referring to FIG. 3, the gate terminal of the first NMOS transistor MN1 covers a surface of the storage diode SD in a semiconductor integrated circuit.

The pixel driving circuit 142*a* may operate in a rolling shutter mode or in a global shutter mode according to states of control signals, for example, the photo-gate control signal PG, the storage control signal SG, the transfer control signal TG, the reset control signal RG and the row selecting control signal SEL, required for operations. In a rolling shutter mode, signals, which are photoelectric-converted by the photo diode PD, of each row in one frame are sequentially selected, and transferred to the floating diffusion node FD, and corresponding image signals are output. In the global shutter mode, signals, which are photoelectric-converted by the photo diode PD, of all the rows in one frame are selected at once, and transferred to the storage diode SD, and corresponding image signals are sequentially output from a selected row.

When the pixel driving circuit 142*a* of FIG. 3 operates in the rolling shutter mode or in the global shutter mode, while enabling the reset control signal (RG) in the pixel selected by the row selecting signal SEL, a signal of the floating diffusion node FD transferred from the supply voltage VDD is output as a reset signal VRES. When the pixel driving circuit 142*a* of FIG. 3 operates in the rolling shutter mode or in the global shutter mode, while enabling the transfer control signal TG, a signal transferred from the photo diode PD to the floating diffusion node FD is output as an image signal VSIG. Generally, in the rolling shutter mode, the image signal is output after the reset signal VRES is output. However, in the global shutter mode, the image signal VSIG is output before the reset signal VRES is output. When the analog-to-digital conversion is performed using a CDS method, the ADC 150 may convert an image signal VSIG having an analog form into a digital signal based on a difference between the image signal VSIG and the reset signal VRES. The control signals, for example, the photo-gate control signal PG, the storage gate control signal SG, the transfer control signal TG, the reset controls signal RG and the row selecting control signal SEL, applied to the pixel driving circuit 142*a* may be generated by the row driver 120 in FIG. 1.

Figure 4:
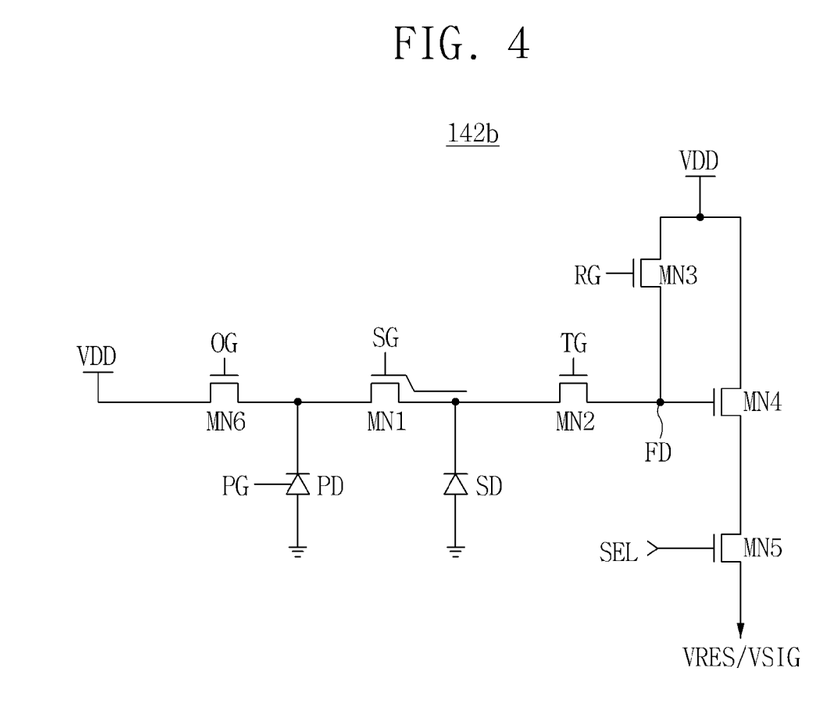
FIG. 4 is a circuit diagram illustrating a pixel driving circuit that drives a unit pixel of the pixel array included in the image sensor of FIG. 1, in accordance with an example embodiment of the inventive concepts.

FIG. 4 is a circuit diagram illustrating a pixel driving circuit 142*b* that drives the unit pixel of the pixel array included in the image sensor 100 of FIG. 1, in accordance with an example embodiment of the inventive concepts.

Referring to FIG. 4, the pixel driving circuit 142*b* may include a photo diode PD, a storage diode SD and NMOS transistors MN1, MN2, MN3, MN4, MN5 and MN6. The pixel driving circuit 142*b* has a similar configuration to that of the pixel driving circuit 142*a* of FIG. 3 and further includes the NMOS transistor MN6. The NMOS transistor MN6 operates in response to an overflow control signal OG. The NMOS transistor MN6 may function to prevent charge in the photo diode region, that is, a cathode of the photo diode PD, from overflowing. The remainder of the pixel driving circuit 142*b* may operate similar to the pixel driving circuit 142*a* of FIG. 3.

Figure 5:
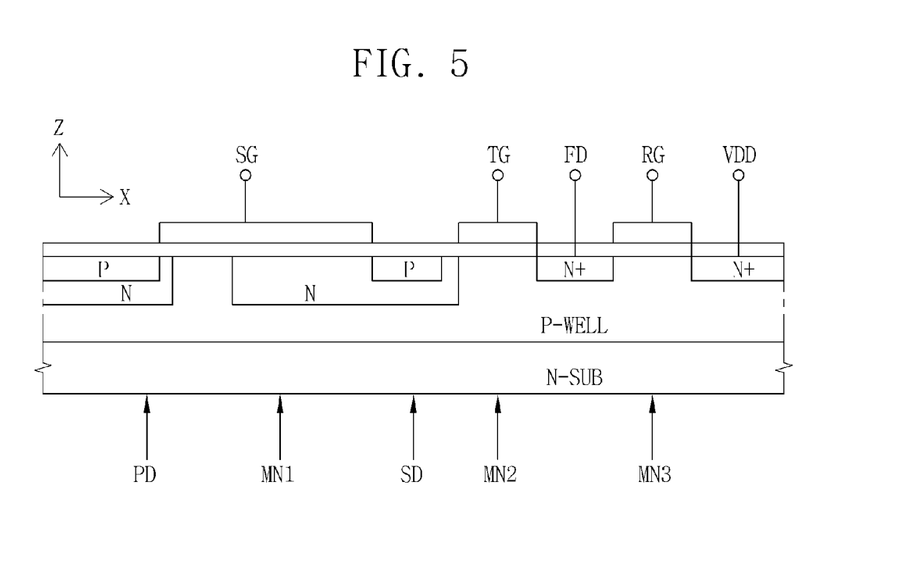
FIG. 5 is a cross-sectional diagram illustrating a vertical structure of an integrated circuit with respect to the pixel driving circuit of FIG. 3, in accordance with an example embodiment of the inventive concepts.

FIG. 5 is a cross-sectional diagram illustrating a vertical structure in an X direction of an integrated circuit with respect to the pixel driving circuit 142*a* of FIG. 3, in accordance with an example embodiment of the inventive concepts. In FIG. 5, a photo diode PD, a storage diode SD, and NMOS transistors MN1, MN2 and MN3 are illustrated. FIG. 5 illustrates that the photo diode PD, the storage diode SD, and the NMOS transistors MN1, MN2 and MN3 are formed in a P-type well P-WELL. The P-type well P-WELL may be formed in an N-type substrate N-SUB. Although the P-type well P-WELL formed in the N-type substrate N-SUB is illustrated in FIG. 5, an embodiment in which an N-type well is formed in a P-type substrate may be used.

Figure 6:
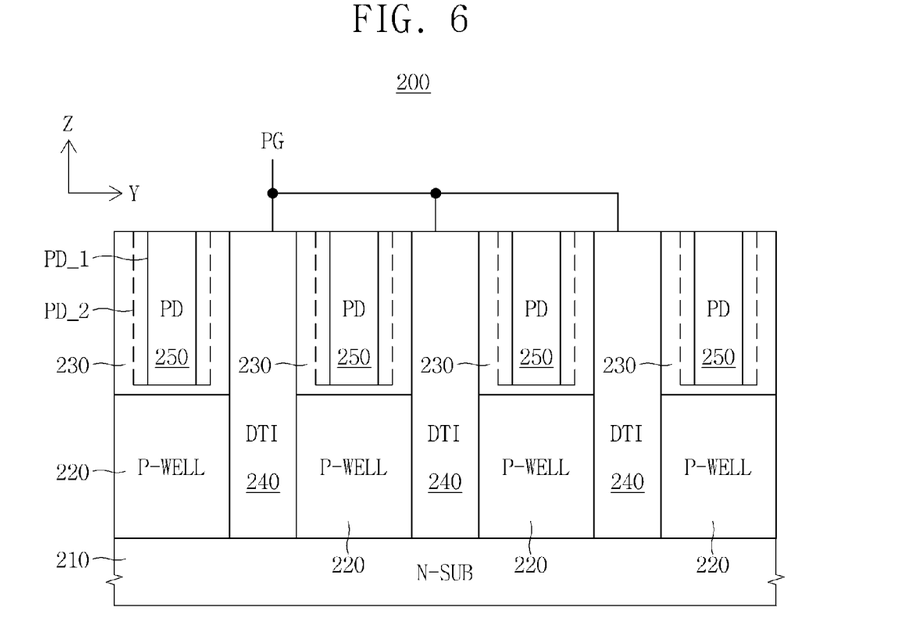
FIG. 6 is a cross-sectional diagram illustrating a vertical structure of an integrated circuit with respect to a pixel array that includes pixels separated by a deep trench isolation (DTI), in accordance with an example embodiment of the inventive concepts.

FIG. 6 is a cross-sectional diagram illustrating a vertical structure in a Y direction of an integrated circuit with respect to a pixel array 200 that includes pixels separated by a DTI, in accordance with an example embodiment of the inventive concepts.

Referring to FIG. 6, a pixel array 200 may include P-type well P_WELL regions 220 formed in an N-type substrate N-SUB 210, N-type well regions 230 formed in the P-type well P_WELL regions 220, and DTI DTI regions 240. The P-type well P_WELL regions 220 may be electrically separated from each other by the DTI regions 240. The N-type well regions 230 are photo-diode regions, and the photo diodes (PD) 250 may be formed in the N-type well regions 230. In FIG. 6, the pixel array 200 is illustrated as being formed in the N-type substrate 210, but, alternatively, the pixel array 200 may be formed in a P-type substrate.

The pixel array 200 uses the DTI regions 240 as photo gates. The photo-gate control signal PG may be applied to the DTI regions 240. A magnitude of the photo-gate control signal PG applied to the DTI regions 240 may be adjustable, for example, by toggling. The photo-gate control signal PG may be generated by the row driver 120 in FIG. 1.

The photo-gate control signal PG applied to the DTI regions 240 of the pixel array 200 may have a negative voltage when a high gain is required. When the photo-gate control signal PG having the negative voltage is applied to the DTI region 240, the number of holes may increase at a portion adjacent to the DTI region 240 of a photo-diode region 230 of each pixel included in the pixel array. Therefore, in the image sensor 100 of FIG. 1 including the pixel array 200, a leakage current, especially a dark current, may decrease. When the photo-gate control signal PG having the negative voltage is applied to the DTI region 240, a size of a photo diode PD of each pixel included in the pixel array 200 may decrease, as illustrated by PD_1. The photo-gate control signal PG applied to the DTI region 240 may have a negative voltage when light intensity is low.

When a low gain is required, the photo-gate control signal PG applied to the DTI regions 240 may have a voltage which is higher than a voltage used when a high gain is required. For example, when the low gain is required, the photo-gate control signal PG having a voltage which is equal to or higher than 0 V may be applied to the DTI regions 240. When the photo-gate control signal PG having the voltage which is higher than the voltage used when a high gain is required is applied to the DTI regions 240, the number of holes may decrease at a portion adjacent to a DTI region 240 of a photo-diode region 230 of each pixel included in the pixel array 200. When a photo-gate control signal PG having the voltage equal to or higher than 0 V is applied to the DTI regions 240, a size of a photo diode PD of each pixel included in the pixel array 200 may increase, as illustrated by PD_2. Therefore, when a low gain is required, in the image sensor 100 including the pixel array 200, the number of total electrons contained in the photo diode PD included in each pixel of the pixel array 200 may increase. Therefore, a signal-to-noise ratio (SNR) of the image sensor 100 may be improved. When light intensity is high, the photo-gate control signal PG applied to the DTI regions 240 may have a voltage which is higher than a voltage used when a high gain is required.

Figure 7:
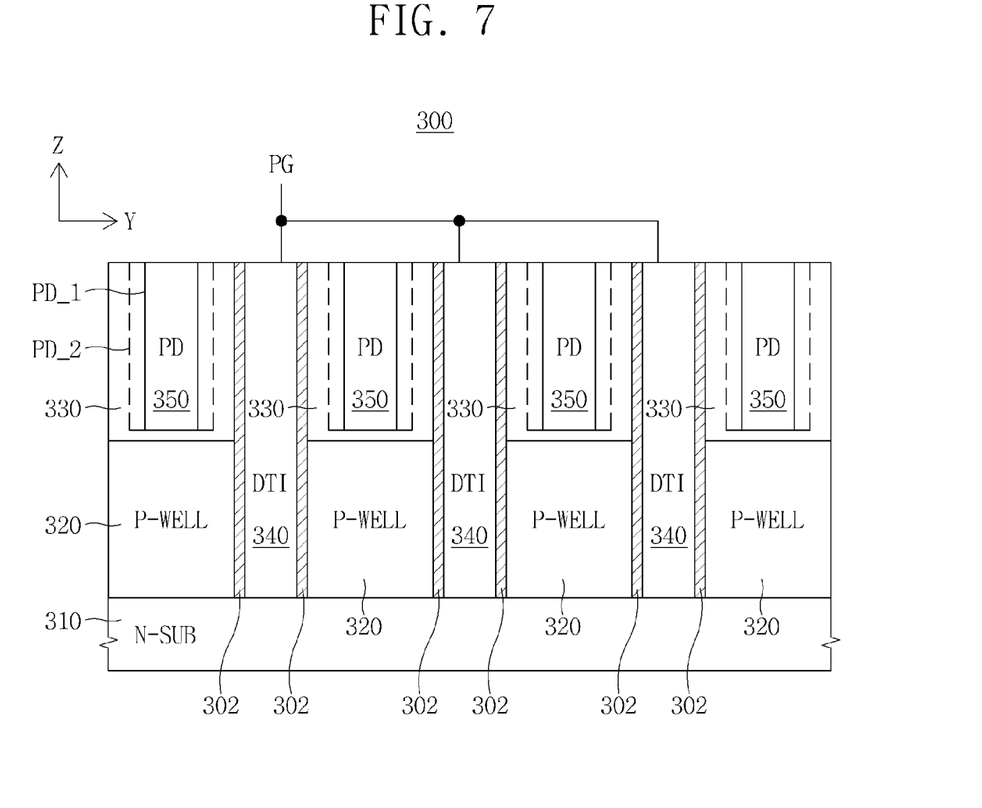
FIG. 7 is a cross-sectional diagram illustrating a vertical structure of an integrated circuit with respect to a pixel array that includes pixels separated by DTI, in accordance with an example embodiment of the inventive concepts.

FIG. 7 is a cross-sectional diagram illustrating a vertical structure of an integrated circuit with respect to a pixel array 300 that includes pixels separated by DTI, in accordance with an example embodiment of the inventive concepts.

Referring to FIG. 7, the pixel array 300 may include P-type well P_WELL regions 320 formed in an N-type substrate N-SUB 310, N-type well regions 330 formed in the P-type well P_WELL regions 320, and DTI regions 340. The P-type well P_WELL regions 320 may be electrically separated from each other by the DTI regions 340. The N-type well regions 330 are photo-diode regions, and the photo diodes (PD) 350 may be formed in the N-type well regions 330. A boron-passivation 302 may be processed in a portion adjacent to the DTI regions 340 of a photo-diode region 330 of each pixel included in the pixel array 300. The boron-passivation 302 extends along sidewalls of the P-type well P_WELL regions 320 and the N-type well regions 330 between the DTI regions 340 and the P-type well P_WELL regions 320 and the N-type well regions 330. In FIG. 7, the pixel array 300 is illustrated as being formed in the N-type substrate 310, but, alternatively, the pixel array 300 may be formed in a P-type substrate.

The pixel array 300 uses the DTI regions 340 as photo gates. The photo-gate control signal PG may be applied to DTI regions 340. A magnitude of the photo-gate control signal PG applied to the DTI regions 340 may be adjustable, for example, by toggling. The photo-gate control signal PG may be generated by the row driver 210 in FIG. 1.

The photo-gate control signal PG applied to the DTI regions 340 of the pixel array 300 may have a negative voltage when a high gain is required. The number of holes may increase at a portion adjacent to the DTI regions 340 of a photo-diode area 330 of each pixel included in the pixel array 300 because of the boron-passivation 302 and the photo-gate control signal PG having the negative voltage applied to the DTI region 340. Therefore, in the image sensor 100 including the pixel array 300, a leakage current, especially a dark current, may decrease. When the photo-gate control signal PG having the negative voltage is applied to the DTI region 340, a size of a photo diode PD of each pixel included in the pixel array 300 may decrease, as illustrated by PD_1. The photo-gate control signal PG applied to the DTI region 340 may have a negative voltage when light intensity is low.

When a low gain is required, the photo-gate control signal PG applied to the DTI regions 340 of the pixel array 300 may have a voltage which is equal to or higher than 0 V. Therefore, in the image sensor 100 of FIG. 1 including the pixel array 300, when a low gain is required, the number of total electrons contained in the photo diode PD included in each pixel of the pixel array 300 may increase. Therefore, a SNR of the image sensor 100 may be improved. When a photo-gate control signal PG having the voltage equal to or higher than 0 V is applied to the DTI regions 340, a size of a photo diode PD of each pixel included in the pixel array 300 may increase, as illustrated by PD_2. An embodiment that requires a low gain may include an embodiment in which light intensity is high.

Figure 8:
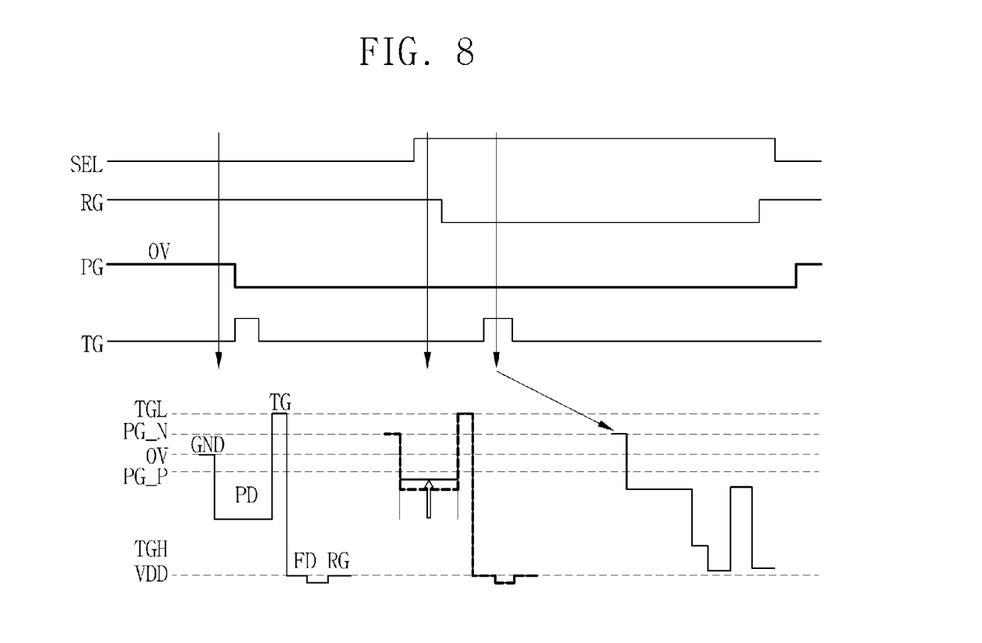
FIG. 8 is a diagram illustrating energy bands according to an operation timing and positions of the pixel driving circuit of FIG. 3, when a photo-gate control signal having a negative voltage is applied to the pixel driving circuit.
Figure 9:
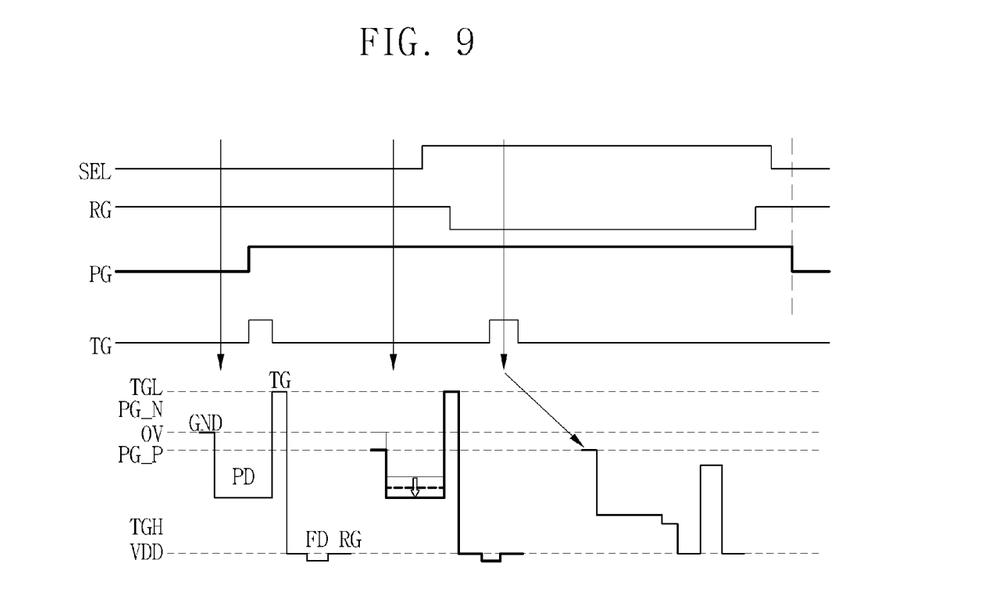
FIG. 9 is a diagram illustrating energy bands according to an operation timing and positions of the pixel driving circuit of FIG. 3, when a photo-gate control signal having a positive voltage is applied to the pixel driving circuit.

FIG. 8 is a diagram illustrating energy bands according to an operation timing and positions of the pixel driving circuit 142*a* of FIG. 3, when a photo-gate control signal PG having a negative voltage is applied to the pixel driving circuit 142*a* of FIG. 3. FIG. 9 is a diagram illustrating energy bands according to an operation timing and positions of the pixel driving circuit 142*a* of FIG. 3, when a photo-gate control signal PG having a positive voltage is applied to the pixel driving circuit 142*a*. In FIGS. 8 and 9, PG_N denotes a photo-gate control signal PG having a negative voltage, and PG_P denotes a photo-gate control signal PG having a positive voltage.

Referring to FIG. 8, after the photo-gate control signal PG is applied to the pixel driving circuit 142*a*, a size of a photo diode PD and the number of total electrons contained in the photo diode PD may decrease by a small amount. After the transfer control signal TG is applied to the pixel driving circuit 142a, it may be noted that a potential difference between the transfer control signal TG and a voltage of the floating diffusion node FD of FIG. 3 is increased. Therefore, in the image sensor 100 including the pixel array, a leakage current, especially a dark current, may decrease.

Referring to FIG. 9, after the photo-gate control signal PG is applied to the pixel driving circuit 142a, a size of a photo diode PD and the number of total electrons contained in the photo diode PD may increase. After the transfer control signal TG is applied to the pixel driving circuit 142a, it may be noted that a potential difference between transfer control signal TG and a voltage of the floating diffusion node FD of FIG. 3 is decreased. Therefore, in the image sensor 100 including the pixel array, a SNR may be improved.

Figure 10:
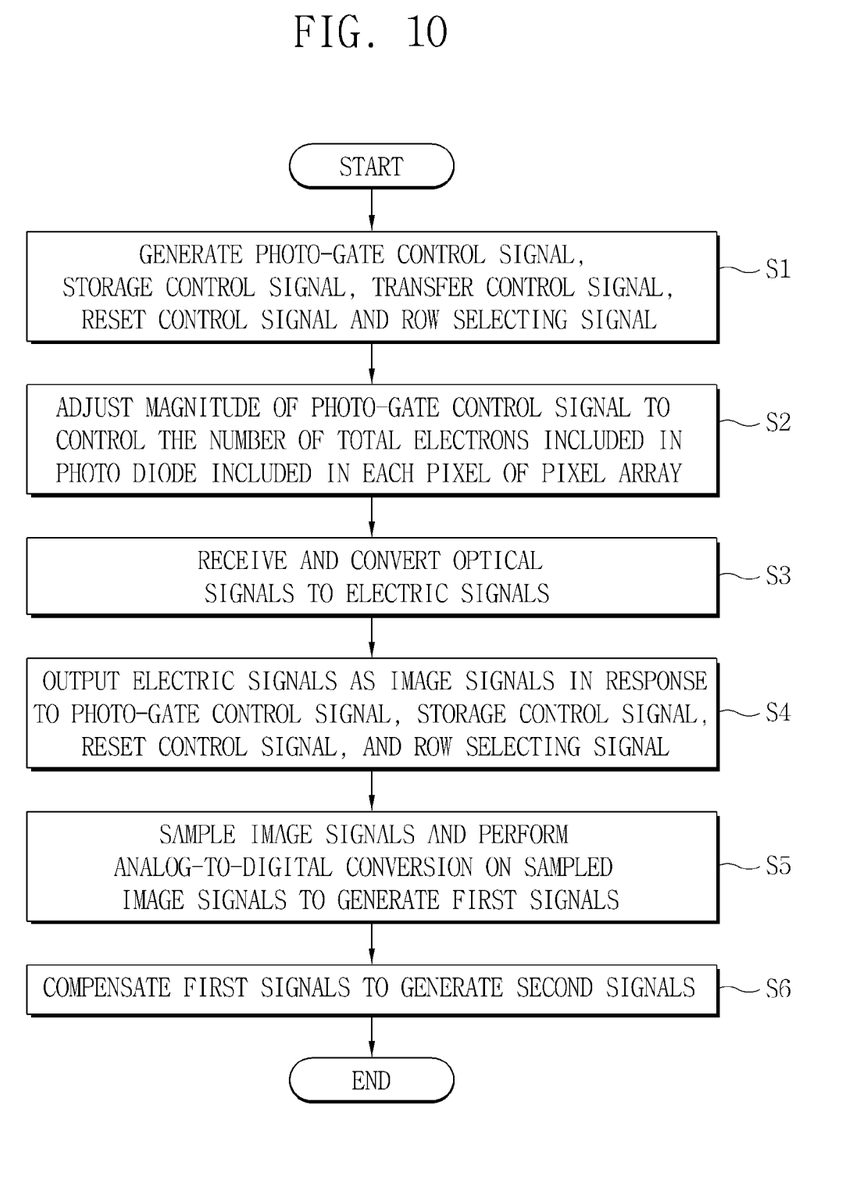
FIG. 10 is a flow chart illustrating a method of operating an image sensor in accordance with an example embodiment of the inventive concepts.

FIG. 10 is a flow chart illustrating a method of operating an image sensor, in accordance with an example embodiment of the inventive concepts.

Referring to FIG. 10, the method of operating the image sensor in accordance with the embodiment of the inventive concept may include the following operations:

(1) generating a photo-gate control signal, a storage control signal, a transfer control signal, a reset control signal and a row selecting signal (S1);

(2) adjusting a magnitude of the photo-gate control signal to control the number of total electrons included in a photo diode included in each pixel of the pixel array (S2);

(3) receiving optical signals and converting the optical signals to electric signals (S3);

(4) outputting the electric signals as image signals in response to the photo-gate control signal, the storage control signal, the transfer control signal, the reset control signal, and the row selecting signal (S4);

(5) sampling the image signals and performing an analog-to-digital conversion on the sampled image signals to generate first signals (S5);

(6) compensating the first signals to generate second signals (S6).

According to the embodiment of FIG. 10, the method of operating the image sensor may further include applying a photo-gate control signal having a negative voltage to the DTI region, when a high gain is required.

According to the embodiment of FIG. 10, the method of operating the image sensor may further include applying a photo-gate control signal having a voltage which is higher than a voltage used when a high gain is required to the DTI region, when a low gain is required.

Figure 11:
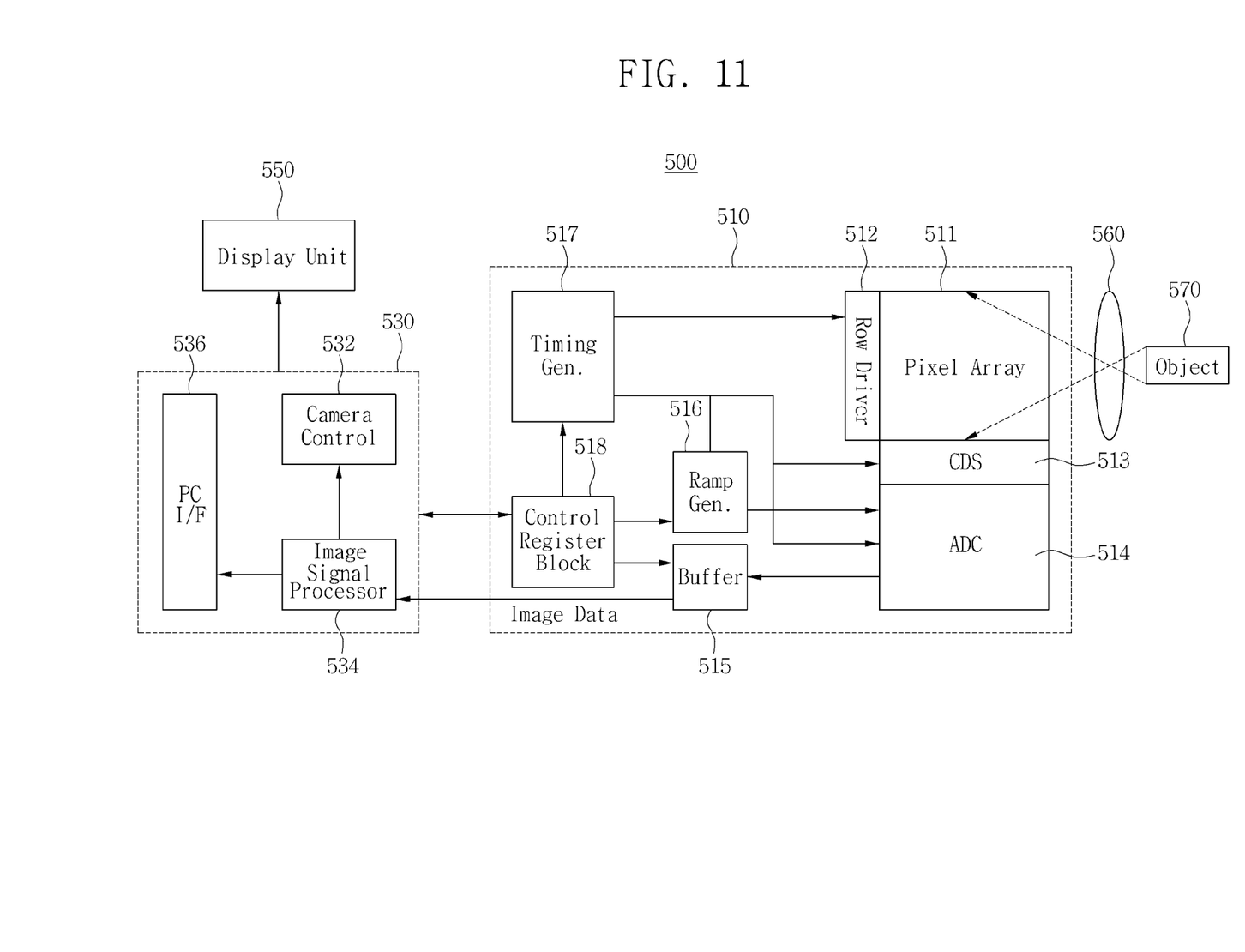
FIG. 11 is a block diagram illustrating an image processing device including the image sensor of FIG. 1 in accordance with an example embodiment of the inventive concepts.

FIG. 11 is a block diagram illustrating an image processing device 500 including the image sensor 500 in accordance with an example embodiment of the inventive concepts.

Referring to FIG. 11, the image processing device 500 may include an image sensor 510, an image processor 530, a display unit 550, and an optical lens 560.

The image processing device 500 may include a digital camera, a data processing device that includes the digital camera, such as a personal computer (PC), a mobile phone, a smart phone, a tablet PC, an information technology (IT) device, or the like. The digital camera may be a digital single-lens reflex (DSLR) camera.

The image sensor 510 converts an optical image of an object 570, which is input through the optical lens 560 under control of the image processor 530, to an electrical image signal. The image sensor may include a timing generator 517, a row driver 512, a pixel array 511, a CDS 513, an ADC 514 and a ramp generator 516. The image sensor 510 may be configured and operate in a manner similar to the image sensor 100 of FIG. 1.

The image sensor 510 may further include a control register block 518. The control register block 518 may generate control signals to control operations of the ramp generator 516, the timing generator 517 and a buffer 515. The operation of the control register block 518 may be controlled by a camera controller 532.

The image processor 530 controls the operation of the image sensor 510, processes image data output from the image sensor 510, and transfers the processed data to the display unit 550 to display the processed data. Image data may be generated according to an output signal of the buffer 515. Here, the display unit 550 may include any devices configured to outputt image signals. For example, the display unit 550 may include a computer, a mobile phone, and other image output terminals.

The image processor 530 may include, for example, the camera controller 532, an image signal processor 534 and a PC interface (I/F) 536.

The camera controller 532 may control the control register block 518. The image signal processor 534 processes image data output from the buffer 515, and outputs the processed data to the display unit 550 through the PC I/F 536.

The image signal processor 534 is illustrated in FIG. 11 as being included in the image processor 530, but alternatively, the image processor 534 may be in the image sensor 510. That is, the image sensor 510 may be implemented as one chip with the image signal processor 534.

Figure 12:
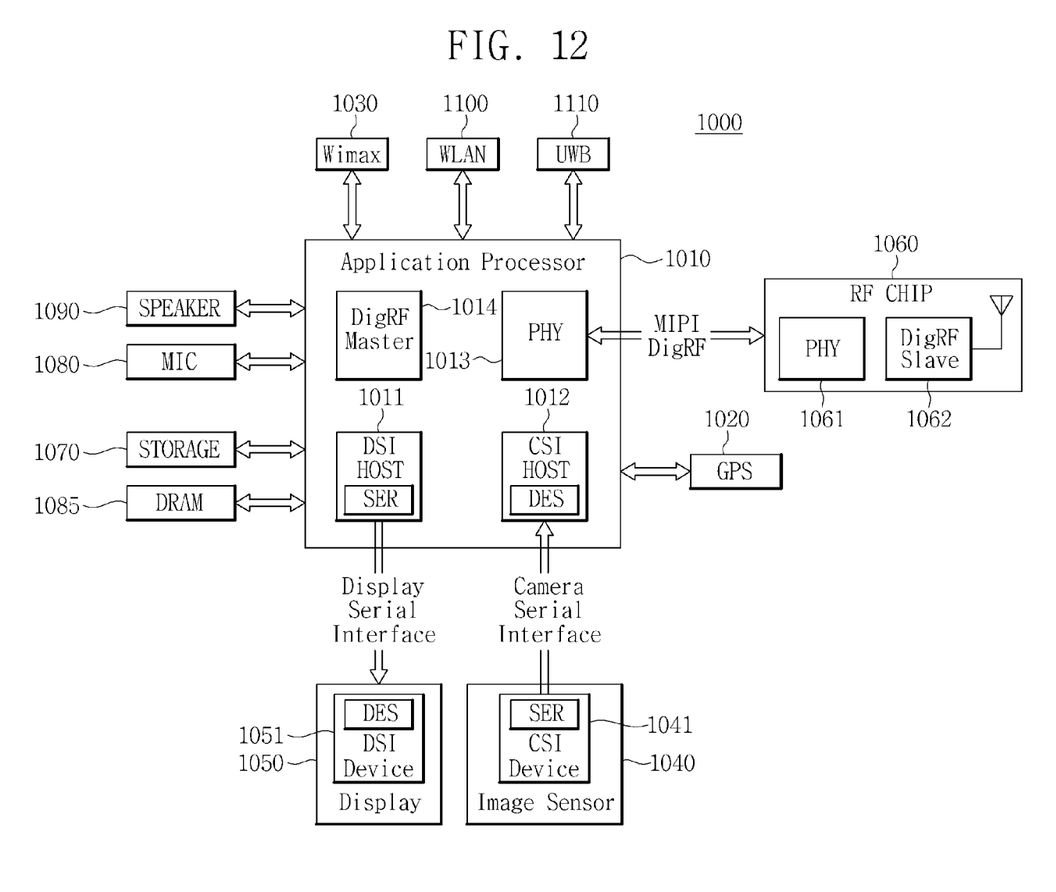
FIG. 12 is a block diagram illustrating an electronic system including the image sensor of FIG. 1 in accordance with an example embodiment of the inventive concepts.

FIG. 12 is a block diagram illustrating an electronic system 1000 including a image sensor 1040 in accordance with an example embodiment of the inventive concepts.

Referring to FIG. 12, the electronic system 1000 may be implemented as a data processing device that may use or support a mobile industry processor interface (MIPI), for example, a mobile phone, a personal digital assistant (PDA), a portable multimedia player (PMP), a smart phone, or the like.

The electronic system 1000 may include an application processor 1010, an image sensor 1040 and a display 1050. The image sensor 1040 may be configured and operate in a manner similar to the image sensor 100 of FIG. 1.

A CSI HOST 1012 implemented in the application processor 1010 may perform a serial communication with a CSI device 1041 of the image sensor 1040 through a camera serial interface (CSI). The CSI HOST 1012 may include an optical serializer DES, and the CSI device 1041 may include an optical deserializer SER.

A DSI HOST 1011 implemented in the application processor 1010 may perform a serial communication with a DSI device 1051 of the display 1050 through a display serial interface (DSI). The DSI HOST 1011 may include an optical deserializer SER, and the DSI device 1051 may include an optical serializer DES.

The electronic system 1000 may further include an RF chip 1060 that communicates with the application processor 1010. The PHY 1061 of the RF chip 1060 and a PHY 1013 of the application processor 1010 may receive or transmit data according to MIPI DigRF. The application processor 1010 may include a DIGRF master 1014. The RF chip 1060 may include a DigRF slave 1062.

The electronic system 1000 may further include a global positioning system (GPS) 1020, a storage 1070, a microphone (MIC) 1080, a DRAM 1085, and a speaker 1090. Further, the electronic system 1000 may include a WiMAX (Wordwide Interoperability for Microwave access) 1030, a WLAN (wireless lan) 1100, and a UWB (ultra wideband) 1110.

The image sensor according to embodiments of the inventive concepts may use a DTI region as a photo gate, decrease a leakage current when light intensity is low, and improve a SNR when light intensity is high. Therefore, the image sensor according to embodiments of the inventive concepts may improve a sensing efficiency.

Embodiments of the inventive concepts may be applied to an image sensor, and an image processing device including the image sensor.

While the inventive concepts have been particularly shown and described with reference to example embodiments thereof, it will be understood that various changes in form and details may be made therein without departing from the spirit and scope of the following claims.

What is claimed is:

1. An image sensor, comprising:
    a row driver configured to generate a photo-gate control signal, a storage control signal, a transfer control signal, a reset control signal and a row selecting signal;
    a pixel array configured to include a plurality of pixels, receive optical signals, convert the optical signals to electric signals, and output the electric signals as image signals in response to the photo-gate control signal, the storage control signal, the transfer control signal, the reset control signal, and the row selecting signal, each pixel of the plurality of pixels using a deep trench isolation (DTI) region as a photo gate;
    an analog-to-digital converter configured to perform an analog-to-digital conversion on the image signals to generate first signals; and
    an output compensating circuit configured to compensate the first signals to generate second signals.

2. The image sensor of claim 1, wherein the photo-gate control signal is applied to the DTI region and wherein a magnitude of the photo-gate control signal applied to the DTI region is adjustable.

3. The image sensor of claim 1, wherein the plurality of pixels included in the pixel array are configured to be electrically separated by the DTI region.

4. The image sensor of claim 1, wherein the image sensor is configured to control a number of total electrons that are included in a photo diode included in each pixel of the plurality of pixels of the pixel array by adjusting a magnitude of the photo-gate control signal applied to the DTI region.

5. The image sensor of claim 1, wherein the photo-gate control signal is applied to the DTI region and wherein the photo-gate control signal applied to the DTI region is configured to have a negative voltage, when a high gain is required.

6. The image sensor of claim 5, wherein, when the photo-gate control signal having the negative voltage is applied to the DTI region of each pixel of the plurality of pixels included in the pixel array, the number of holes increases at a portion of a photo-diode region adjacent to the DTI region of each pixel of the plurality of pixels included in the pixel array.

7. The image sensor of claim 5, wherein, when the photo-gate control signal having the negative voltage is applied to the DTI region of each pixel of the plurality of pixels included in the pixel array, a size of a photo diode of each pixel included in the pixel array decreases.

8. The image sensor of claim 1, wherein the photo-gate control signal applied to the DTI region is configured to have a negative voltage when light intensity is low.

9. The image sensor of claim 1, wherein, when a low gain is required, the photo-gate control signal applied to the DTI region is configured to have a voltage which is higher than a voltage used when a high gain is required.

10. The image sensor of claim 9, wherein, when the photo-gate control signal having the voltage which is higher than the voltage used when a high gain is required is applied to the DTI region of each pixel of the plurality of pixels included in the pixel array, a number of holes decreases at a portion of a photo-diode region adjacent to the DTI region of each pixel included in the pixel array.

11. The image sensor of claim 9, wherein when the photo-gate control signal having the voltage which is higher than the voltage used when a high gain is required is applied to the DTI region, a size of a photo diode of each pixel of the plurality of pixels included in the pixel array increases.

12. The image sensor of claim 1, wherein, when light intensity is high, the photo-gate control signal applied to the DTI region is configured to have a voltage which is higher than a voltage used when a high gain is required.

13. A method of operating an image sensor, the method comprising:
    generating a photo-gate control signal, a storage control signal, a transfer control signal, a reset control signal and a row selecting signal;
    adjusting a magnitude of the photo-gate control signal applied to a DTI region to control a number of total electrons that are included in a photo diode included in each pixel of a pixel array;
    receiving optical signals and converting the optical signals to electric signals;
    outputting the electric signals as image signals in response to the photo-gate control signal, the storage control signal, the transfer control signal, the reset control signal, and the row selecting signal;
    sampling the image signals and performing an analog-to-digital conversion on the sampled image signals to generate first signals; and
    compensating the first signals to generate second signals.

14. The method of claim 13, further comprising;
    applying a photo-gate control signal having a negative voltage to the DTI region, when a high gain is required.

15. The method of claim 13, further comprising;
    applying a photo-gate control signal having a voltage which is higher than a voltage used when a high gain is required to the DTI region, when a low gain is required.

16. An image sensor, comprising:
    a row driver configured to generate a photo-gate control signal, a storage control signal, a transfer control signal, a reset control signal and a row selecting signal;
    a pixel array configured to include a plurality of pixels, receive the photo-gate control signal, the storage control signal, the transfer control signal, the reset control signal and the row selecting signal, receive optical signals, convert the optical signals to electric signals, and output the electric signals as image signals in response to the photo-gate control signal, the storage control signal, the transfer control signal, the reset control signal, and the row selecting signal, the plurality of pixels of the pixel array being electrically separated from each other by a deep trench isolation (DTI) region;

an analog-to-digital converter configured to perform an analog-to-digital conversion on the image signals to generate first signals; and an output compensating circuit configured to compensate the first signals to generate second signals.

17. The image sensor of claim 16, wherein each pixel of the plurality of pixels of the pixel array uses the DTI region as a photo gate.

18. The image sensor of claim 16, wherein the photo-gate control signal is applied to the DTI region and wherein a magnitude of the photo-gate control signal applied to the DTI region is adjustable.

19. The image sensor of claim 16, wherein the image sensor is configured to control a number of total electrons that are included in a photo diode included in each pixel of the plurality of pixels of the pixel array by adjusting a magnitude of the photo-gate control signal applied to the DTI region.

20. The image sensor of claim 16, wherein the photo-gate control signal is applied to the DTI region and wherein, when a high gain is required, the photo-gate control signal applied to the DTI region is configured to have a negative voltage and wherein, when a low gain is required, the photo-gate control signal applied to the DTI region is configured to have a voltage which is higher than the voltage used when a high gain is required.

* * * * *